(12) United States Patent
Van Haren et al.

(10) Patent No.: US 7,619,738 B2
(45) Date of Patent: Nov. 17, 2009

(54) MARKER STRUCTURE FOR OPTICAL ALIGNMENT OF A SUBSTRATE, A SUBSTRATE INCLUDING SUCH A MARKER STRUCTURE, AN ALIGNMENT METHOD FOR ALIGNING TO SUCH A MARKER STRUCTURE, AND A LITHOGRAPHIC PROJECTION APPARATUS

(75) Inventors: Richard Johannes Franciscus Van Haren, Veldhoven (NL); Paul Christiaan Hinnen, Veldhoven (NL); Sanjay Lalbahadoersing, Helmond (NL); Henry Megens, Eindhoven (NL); Maurits Van Der Schaar, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 92 days.

(21) Appl. No.: 12/003,377

(22) Filed: Dec. 21, 2007

(65) Prior Publication Data

US 2008/0180668 A1    Jul. 31, 2008

Related U.S. Application Data

(62) Division of application No. 10/665,360, filed on Sep. 22, 2003, now Pat. No. 7,330,261.

(60) Provisional application No. 60/411,861, filed on Sep. 20, 2002, provisional application No. 60/413,601, filed on Sep. 26, 2002.

(30) Foreign Application Priority Data

Apr. 1, 2003  (EP) ................................. 03075954
May 12, 2003  (EP) ................................. 03076422

(51) Int. Cl.
*G01J 4/00* (2006.01)
*G01B 11/00* (2006.01)

(52) U.S. Cl. .................. 356/401; 356/364; 356/400

(58) Field of Classification Search ......... 356/399–401, 356/364
See application file for complete search history.

(56) References Cited

U.S. PATENT DOCUMENTS 4,037,969 A    7/1977   Feldman et al.

(Continued)

FOREIGN PATENT DOCUMENTS

JP            3-65603 A          3/1991

(Continued)

OTHER PUBLICATIONS

P. Hinnen et al.: "Advances in Process Overlay" Proceedings of the SPIE, vol. 4344, Feb. 2001, pp. 114-126.

(Continued)

*Primary Examiner*—L. G Lauchman
(74) *Attorney, Agent, or Firm*—Pillsbury Winthrop Shaw Pittman LLP

(57) ABSTRACT

A marker structure on a substrate for optical alignment of the substrate includes a plurality of first structural elements and a plurality of second structural elements. In use, the marker structure allows the optical alignment based upon providing at least one light beam directed on the marker structure, detecting light received from the marker structure at a sensor, and determining alignment information from the detected light, the alignment information comprising information relating a position of the substrate to the sensor.

25 Claims, 5 Drawing Sheets

U.S. PATENT DOCUMENTS

| | | | |
|---|---|---|---|
| 4,251,160 | A | 2/1981 | Bouwhuis et al. |
| 4,326,805 | A | 4/1982 | Feldman et al. |
| 4,355,892 | A | 10/1982 | Mayer et al. |
| 4,398,824 | A | 8/1983 | Feldman et al. |
| 4,514,858 | A | 4/1985 | Novak |
| 4,540,277 | A | 9/1985 | Mayer et al. |
| 4,614,432 | A | 9/1986 | Kuniyoshi et al. |
| 4,690,529 | A | 9/1987 | Sugiyama et al. |
| 4,710,026 | A | 12/1987 | Magome et al. |
| 4,748,333 | A | 5/1988 | Mizutani et al. |
| 4,778,275 | A | 10/1988 | Van Den Brink et al. |
| 4,814,829 | A | 3/1989 | Kosugi et al. |
| 4,828,392 | A | 5/1989 | Nomura et al. |
| 4,857,744 | A | 8/1989 | Kataoka et al. |
| 4,861,162 | A | 8/1989 | Ina |
| 4,870,452 | A | 9/1989 | Tanimoto et al. |
| 4,952,970 | A | 8/1990 | Suzuki et al. |
| 5,100,237 | A | 3/1992 | Wittekoek et al. |
| 5,114,236 | A | 5/1992 | Matsugu et al. |
| 5,118,953 | A | 6/1992 | Ota et al. |
| 5,144,363 | A | 9/1992 | Wittekoek et al. |
| 5,151,754 | A | 9/1992 | Ishibashi et al. |
| 5,160,849 | A | 11/1992 | Ota et al. |
| 5,229,872 | A | 7/1993 | Mumola |
| 5,243,195 | A | 9/1993 | Nishi |
| 5,296,891 | A | 3/1994 | Vogt et al. |
| 5,347,356 | A | 9/1994 | Ota et al. |
| 5,418,613 | A | 5/1995 | Matsutani |
| 5,477,057 | A | 12/1995 | Angeley et al. |
| 5,488,230 | A | 1/1996 | Mizutani et al. |
| 5,489,986 | A | 2/1996 | Magome et al. |
| 5,523,193 | A | 6/1996 | Nelson |
| 5,543,921 | A | 8/1996 | Uzawa et al. |
| 5,559,601 | A | 9/1996 | Gallatin et al. |
| 5,596,204 | A | 1/1997 | Irie et al. |
| 5,674,650 | A | 10/1997 | Dirksen et al. |
| 5,801,390 | A | 9/1998 | Shiraishi |
| 5,808,910 | A | 9/1998 | Irie et al. |
| 5,910,847 | A | 6/1999 | Van Der Werf et al. |
| 5,920,376 | A | 7/1999 | Bruckstein et al. |
| 5,920,378 | A | 7/1999 | Murakami et al. |
| 5,933,744 | A | 8/1999 | Chen et al. |
| 5,969,441 | A | 10/1999 | Loopstra et al. |
| 6,023,338 | A | 2/2000 | Bareket |
| 6,034,378 | A | 3/2000 | Shiraishi |
| 6,046,792 | A | 4/2000 | Van Der Werf et al. |
| 6,133,641 | A | 10/2000 | Hamada et al. |
| 6,233,494 | B1 | 5/2001 | Aoyagi |
| 6,242,754 | B1 | 6/2001 | Shiraishi et al. |
| 6,262,796 | B1 | 7/2001 | Loopstra et al. |
| 6,271,919 | B1 | 8/2001 | Matsuura |
| 6,297,876 | B1 | 10/2001 | Bornebroek |
| 6,420,791 | B1 | 7/2002 | Huang et al. |
| 6,819,426 | B2 | 11/2004 | Sezginer et al. |
| 6,844,918 | B2 * | 1/2005 | Koren et al. ............... 355/53 |
| 6,858,948 | B2 | 2/2005 | Van Haren |
| 6,985,618 | B2 | 1/2006 | Adel et al. |
| 7,061,615 | B1 | 6/2006 | Lowe-Webb |
| 7,099,010 | B2 | 8/2006 | Schultz |
| 7,112,813 | B2 * | 9/2006 | Den Boef et al. ......... 250/559.3 |
| 7,332,732 | B2 * | 2/2008 | Van Bilsen et al. .......... 250/548 |
| 2002/0001761 | A1 | 1/2002 | Mizutani et al. |
| 2002/0158193 | A1 | 10/2002 | Sezginer et al. |
| 2003/0002043 | A1 | 1/2003 | Abduljalim et al. |

FOREIGN PATENT DOCUMENTS

| | | |
|---|---|---|
| JP | 3-123804 A | 5/1991 |
| JP | 3-262901 A | 11/1991 |
| JP | 6-224104 A | 8/1994 |
| JP | 10-270346 A | 10/1998 |
| JP | 11-329914 | 11/1999 |
| JP | 2001-060543 A | 3/2001 |
| JP | 2001-185474 A | 7/2001 |
| JP | 2005-259109 A | 9/2005 |
| WO | WO 98/33096 | 7/1998 |
| WO | WO 98/38597 A2 | 9/1998 |
| WO | WO 98/38597 A3 | 9/1998 |
| WO | 02/19415 A1 | 3/2002 |
| WO | WO 02/065545 A2 | 8/2002 |

OTHER PUBLICATIONS

J. Huijbregtse et al: "Overlay Performance with Advanced ATHENA Alignment Strategies" Proceedings of the SPIE,, vol. 5038, Jan. 2003, pp. 918-928.

G. Rivera et al.: "Overlay Performance on Tungsten CMP Layers Using the ATHENA Alignment System" Proceedings of the SPIE, vol. 3998, Jul. 2000, pp. 428-440.

S. Warrick et al.: "Integration of New Alignment Mark Designs in Dual Inlaid Copper Interconnect Processes" Proceedings of the SPIE, vol. 4691, 2002, pp. 971-980.

J. Neijzen et al., "Improved Wafer Stepper Alignment Performance Using an Enhanced Phase Grating Alignment System" Proceedings of the SPIE, vol. 3677, 1999, pp. 382-394.

R. Navarro et al., "Extended ATHENA Alignment Performance and Application For the 100 nm Technology Node" Proceedings of the SPIE, vol. 4344, Feb. 2001, pp. 682-694.

K. Prasad et al., "W-CMP Alignment Using ASML's ATHENA System on an I-line Stepper" Proceedings of SPIE, vol. 4344, 2001, pp. 79-88.

European Search Report issued on Feb. 25, 2009 in European Application No. 03077976.3.

European Search Report issued on Mar. 13, 2009 in European Application No. 03077974.8.

English Translation of Japanese Official Action issued on Mar. 4, 2009 in Japanese Application No. 2008-119913.

Chinese Office Action for Chinese Application No. 03164840.1 dated Jun. 20, 2008.

Markle, D. A., "Submicron 1:1 Optical Lithography", Semi-conductor International, pp. 173-142, May 1986.

\* cited by examiner

Prior Art

MARKER STRUCTURE FOR OPTICAL ALIGNMENT OF A SUBSTRATE, A SUBSTRATE INCLUDING SUCH A MARKER STRUCTURE, AN ALIGNMENT METHOD FOR ALIGNING TO SUCH A MARKER STRUCTURE, AND A LITHOGRAPHIC PROJECTION APPARATUS

CROSS REFERENCE TO RELATED APPLICATIONS

This application is a divisional of U.S. patent application Ser. No. 10/665,360, filed Sep. 22, 2003, now U.S. Pat. No. 7,330,261 which claims benefit and priority to U.S. Patent Application No. 60/411,861, filed Sep. 20, 2002, and U.S. Patent Application No. 60/413,601, filed Sep. 26, 2002, each of the foregoing applications incorporated herein by reference in its entirety, and priority to European Patent Application No. 03076422.9, filed May 12, 2003 and European Patent Application No. 03075954.2, filed Apr. 1, 2003.

BACKGROUND

1. Field

The present invention relates to a marker structure for optical alignment of a substrate, a substrate including such a marker structure, an alignment method for aligning to such a marker structure and a lithographic projection apparatus.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

For a lithographic process, an alignment of the wafer to be processed with the mask pattern on the mask should be as precise as possible for a correct definition of features on the substrate, which features all should have sizes within specified tolerances. To this end, the lithographic projection apparatus includes a wafer alignment module which provides for alignment of the substrate with the mask and mask pattern within a given (specified) tolerance. The wafer alignment system typically performs the alignment based on optical devices. The position of a wafer or a portion of a wafer is determined by measuring an optical response from an optical marker which is illuminated by an optical source: for example, a grating is illuminated by a laser beam, the laser beam diffracts from the grating, and one or more of the diffracted orders are measured by respective sensors, which are typically located on a reference plane. Using the output of the sensors the position of the wafer can be derived (relative to the reference plane).

In the prior art, optical markers include a grating with a periodicity suitable for diffraction of impinging light with a wavelength well within the visible range of the spectrum. A typical periodicity is 16 □m. The grating is typically constructed of lines and trenches. Typically, the line width and trench width are each 8 □m. In order to obtain sufficient diffracted light from the grating and to obtain well-defined diffraction maxima and minima, the grating must encompass a minimal number of lines and intermediate trenches. The size in the direction of the periodic structure is about 750 μm.

The grating may be a phase grating or phase marker which takes into account a phase difference between the phase of rays scattered at the upper surface of the grating and the phase of rays scattered at the lower surface of the grating.

Also, the grating may be an amplitude grating which only takes into account the periodic structure of the grating without any further phase difference relating to an upper or lower level in the grating. Typically, an amplitude grating or amplitude marker is constructed of a periodic structure of first and second elements, which have similar surface levels but different respective reflectance.

Optical markers are used during microelectronic device processing (or IC processing) along the full manufacturing line. During the front end of line (FEOL), markers are used for alignment during manufacturing of transistor structures. At a later stage during the back end of line (BEOL), markers are needed for alignment of metallisation structures, e.g. connect lines, and vias. It is noted that in both cases the integrity of the markers must be sufficient to meet the required accuracy of alignment.

During semiconductor manufacturing processes a wafer is subjected to a plurality of treatments such as annealing, etching, polishing, etc., which may likely cause roughness of a marker (a recessed area in the marker and/or warping of the marker). Such marker roughness causes an alignment error of the image which may contribute to an overlay error in the construction of a semiconductor device. Also, it is conceivable that during the subsequent stages of processing the quality of markers tend to diminish.

A disadvantage of prior art optical markers is that during IC processing it is difficult to control the phase depth of the optical marker. As a result, the intensity of diffracted light under a given diffraction angle may be low, and even close to zero, and accurate measurement of the diffracted beam may be difficult, or even impossible. The phase depth can be defined as the resolved height difference between a top surface of a line and a top surface of a trench in a grating under a given angle of diffraction. If under an angle of diffraction, where (under optimal conditions) a maximum of diffracted intensity is expected, the phase depth equals half a wavelength of the applied radiation, interference between diffracted waves will result in a low or zero intensity.

Control of the phase depth during IC processing may be difficult due to process variations from wafer to wafer, and also across a single wafer.

A further disadvantage of prior art markers results from the dependence of marker properties as a function of the layer(s) below the marker. It is known that due to different optical behaviour of the various layers, as found in semiconductor devices, the contrast of the marker may vary, which results in variations of the diffracted intensity as function of the layer below.

Moreover, it is known that various processing steps may adversely influence the shape of alignment markers. Due to the effect on the shape, the alignment by such modified markers may comprise an error which can result from the fact that the modified shape of the marker changes the generated (pattern of) diffracted beams.

Furthermore, in the prior art, during BEOL processing, optical markers could be detected under capping layers by virtue of the residual structure which was visible at the surface. However, due to application of planarisation processes such as chemical mechanical polishing (CMP), the option to use a residual marker structure for alignment in many cases has become impossible.

In the prior art, markers on a semiconductor substrate that comprise trenches filled with tungsten, are subjected to a CMP process for removing tungsten from the surface and planarising the surface. Due to the CMP process, the tungsten structures are either filled or underfilled. The extent of filling is related to the phase depth of an optical signal generated by the marker, i.e., two discrete phase depth levels exist. One level relates to filled tungsten structures which are shallow and have a small phase depth, the other level relates to underfilled tungsten structures which are relatively deep and have a large phase depth. Small phase depth of the filled markers is undesirable since the alignment error caused by the small phase depth is relatively large. Also, the large phase depth does not guarantee that the alignment error is reduced: the phase depth may be such that extinction of the optical signal results. Furthermore, no control over the phase depth is obtained.

The influence of optical markers on IC processing may lead to undesirable side effects due to the fact that the optical markers are inherently larger than feature sizes in integrated circuits. In the prior art, the minimum feature size of markers is in the order of 1 □m. In current microelectronic devices, the typical minimal feature size is about 100 nm (depending on the device generation). Since the marker usually includes the same material as (part of) the devices, the presence of an additional marker area of a substantial size in the vicinity of a device may have an influence on the local processing rate for that device in a given processing step. For example, a chemical reaction in a reactive ion etching process or a chemical deposition process may be influenced by the presence of a large marker area due to some kinetic constraint, or due to a local deviation of the wafer temperature, etc. A size difference between marker and device feature may thus lead, for example, to modification of a processing step for devices located closely to a marker. Due to the modification of the processing a variation of device characteristics may occur across a die and/or a wafer.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "projection beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm).

SUMMARY

It is an aspect of the present invention to provide a marker structure that allows correction of the phase depth in such a way that negative interference within the diffraction pattern is prevented.

In a first aspect of the present invention, a marker structure on a substrate for optical alignment of the substrate includes a plurality of first structural elements and a plurality of second structural elements, in use the marker structure allowing the optical alignment based upon providing at least one light beam directed on the marker structure, detecting light received from the marker structure at a sensor, determining alignment information from the detected light, the alignment information including information relating a position of the substrate to the sensor, wherein the first structural element has a first reflecting surface on a first level and a second reflecting surface on a second level lower than the first level, the second structural element is substantially non-reflecting, a separation between the first and second reflecting surfaces determines a phase depth condition for the detected light, and a recess is provided in the second reflecting surface to modify the phase depth condition.

The recessed area changes the phase depth by an amount that produces a positive interference with sufficient intensity seen at the sensor.

In a second aspect of the present invention, a marker structure on a substrate for optical alignment of the substrate includes a plurality of first structural elements and a plurality of second structural elements, in use the marker structure allowing the optical alignment based upon providing at least one light beam directed on the marker structure, detecting light received from the marker structure at a sensor, determining alignment information from the detected light, the alignment information including information relating a position of the substrate to the sensor, wherein the first structural element has a first reflecting surface on a first level and a second reflecting surface on a second level lower than the first level, the second structural element is substantially non-reflecting, a separation between the first and second reflecting surfaces determines a phase depth condition for the detected light, and the second reflecting surface includes a plurality of additional structural elements located above an opaque layer.

Advantageously, the variation of the detected intensity as a function of the underlying layer is reduced by the stacking of marker structures above each other. The intermediate dielectric layer can be tuned to have an optimal phase depth with positive interference.

It is a further aspect of the present invention to provide a marker structure that allows monitoring of processing-induced damage. According to this aspect, a marker structure on a substrate for optical alignment includes a plurality of first structural elements and a plurality of second structural elements, in use the marker structure allowing the optical alignment based upon providing at least one light beam directed on the marker structure, detecting light received from the marker structure at a sensor, determining alignment information from the detected light, the alignment information including information relating a position of the substrate to the sensor, wherein the marker structure includes a first periodic structure and a second periodic structure, the second periodic structure is adjacent and parallel to the first periodic structure, the first periodic structure includes a plurality of first structural elements of a first material having a first width and a plurality of second structural elements of a second material having a second width, the first and second structural elements are arranged in a repetitive order, with the first width being larger than the second width, the second periodic structure includes a plurality of the first structural elements of the second material having a third width and a plurality of the second structural elements of the first material having a fourth width, the first and second structural elements being arranged in a repetitive order, the third width being equal to the first width and the fourth width being equal to the second width, and the first structural element in the second periodic structure being located adjacent to the first structural element in the first periodic structure in such a manner that the second periodic structure is complementary to the first periodic structure.

By such a complementary structure, which includes a first periodic structure and a second periodic structure complementary to the first one, it is possible to monitor by use of the alignment system if one of the structural elements within a periodic structure is damaged by the IC processing sequence, since a diffraction pattern will change differently for the first periodic structure than for the second periodic structure when damage occurs on either the first or the second structural element within the first and the second periodic structure.

It is another aspect of the present invention to provide a marker structure that overcomes the removal of a residual marker structure from a metallization layer due to CMP processing of the underlying layer which includes the marker structure. According to this aspect, a marker structure includes a plurality of first structural elements and a plurality of second structural elements, in use the marker structure allowing the optical alignment based upon providing at least one light beam directed on the marker structure, detecting light received from the marker structure at a sensor, determining alignment information from the detected light, the alignment information including information relating a position of the substrate to the sensor, wherein the marker structure is present in a metallization layer, the first structural element includes a first surface area portion having a first surface state and the second structural element includes a second surface area portion having a second surface state, the first surface area portion being related to a first buried marker element, and the second surface area portion being related to a second buried marker element, the first and the second surface state being related to variations in morphology of the metallization layer being induced by the first buried marker element and the second buried marker element, respectively.

Advantageously, the metallization layer is deposited in such a way that a difference in surface state/morphology as a function of the underlying material is created in that metallization layer. The periodic variation of surface state/morphology of the surface is detectable by an alignment and/or overlay system.

It is an aspect of the present invention to provide a marker structure that overcomes effects caused by a relatively large marker area on features of devices located in the vicinity of such a large marker area. According to this aspect, a marker structure includes a plurality of first structural elements and a plurality of second structural elements, in use the marker structure allowing the optical alignment based upon providing at least one light beam directed on the marker structure, detecting light received from the marker structure at a sensor, determining alignment information from the detected light, the alignment information including information relating a position of the substrate to the sensor, wherein the first structural element comprises a plurality of primary lines and a plurality of first interposed lines.

Advantageously, the structural elements that form the marker structure are each sub-divided in sub-elements which have a characteristic size comparable to the product feature size. By mimicking the feature size of the product more closely, size-induced processing effects are minimised.

Moreover, it is an aspect of the present invention to provide a lithographic projection apparatus which allows application of the marker structure as described above.

Furthermore, it is an aspect of the present invention to provide a method of alignment of a substrate in a lithographic projection apparatus which uses the marker structure as described above.

BRIEF DESCRIPTION OF THE DRAWINGS

Embodiments of the present invention will now be described, by way of example only, with reference to the following drawings, wherein.

In the Figures, like symbols indicate like parts.

DETAILED DESCRIPTION

Figure 1:
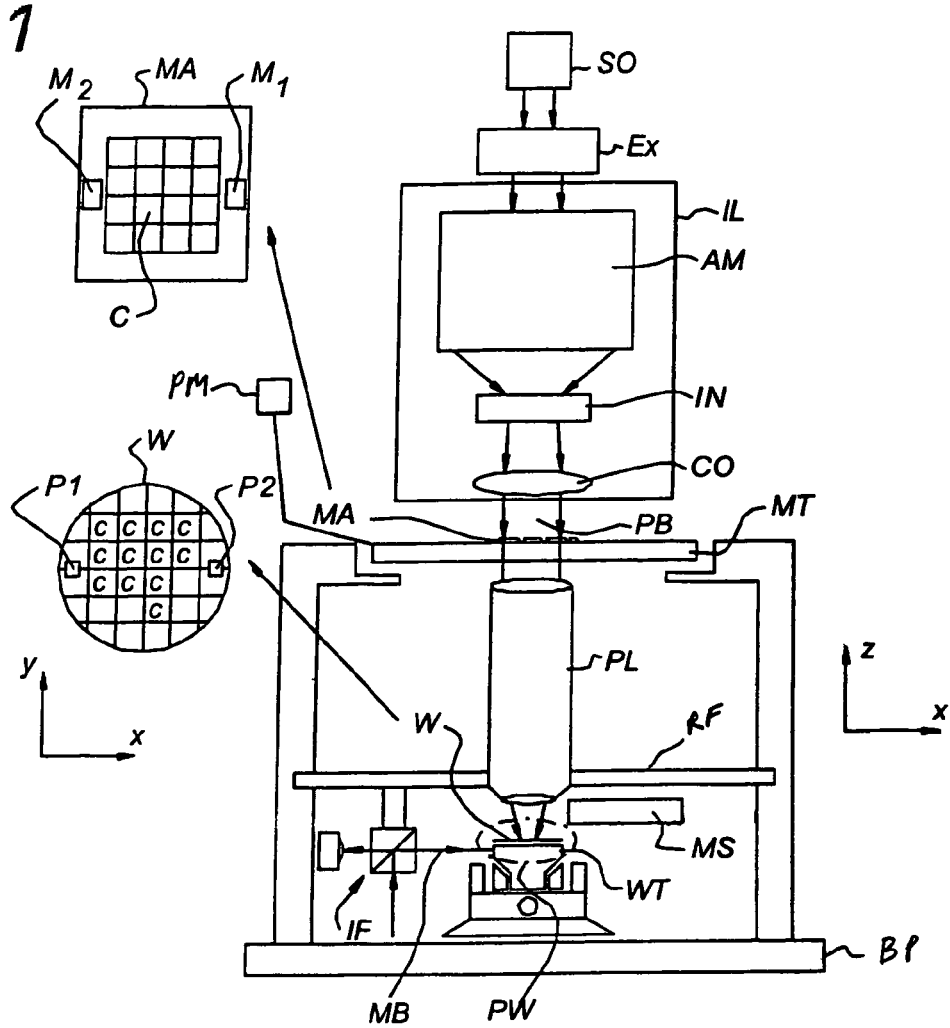
FIG. 1 depicts a lithographic projection apparatus comprising at least one marker structure according to the present invention.

FIG. 1 schematically depicts a lithographic projection apparatus 1 according to an embodiment of the present invention. The apparatus includes a base plate BP. The apparatus may also include a radiation source SO (e.g. UV or EUV radiation, such as, for example, generated by an excimer laser operating at a wavelength of 248 nm, 193 nm or 157 nm, or by a laser-fired plasma source operating at 13.6 nm). A first object (mask) table MT is provided with a mask holder configured to hold a mask MA (e.g. a reticle), and is connected to a first positioning device PM that accurately positions the mask with respect to a projection system or lens PL. A second object (substrate) table WT is provided with a substrate holder configured to hold a substrate W (e.g. a resist-coated silicon wafer), and is connected to a second positioning device PW that accurately positions the substrate with respect to the projection system or lens PL. The projection system or lens PL (e.g. a quartz and/or $CaF_2$ lens system or a refractive or catadioptric system, a mirror group or an array of field deflectors) is configured to image an irradiated portion of the mask MA onto a target portion C (e.g., comprising one or more dies) of the substrate W.

The projection system PL is supported on a reference frame RF. As here depicted, the apparatus is of a transmissive type (i.e. has a transmissive mask). However, in general, it may also be of a reflective type, (e.g. with a reflective mask). Alternatively, the apparatus may employ another kind of patterning device, such as a programmable mirror array of a type as referred to above.

The source SO (e.g. a UV excimer laser, an undulator or wiggler provided around the path of an electron beam in a storage ring or synchrotron, a laser-produced plasma source, a discharge source or an electron or ion beam source) produces radiation. The radiation is fed into an illumination system (illuminator) IL, either directly or after having traversed a conditioner, such as a beam expander Ex, for example. The illuminator IL may include an adjusting device AM configured to set the outer and/or inner radial extent (commonly referred to as σ-outer and σ-inner, respectively) of the intensity distribution in the beam. In addition, it will generally comprise various other components, such as an integrator IN and a condenser CO. In this way, the projection beam PB impinging on the mask MA has a desired uniformity and intensity distribution in its cross-section.

It should be noted with regard to FIG. 1 that the source SO may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source SO is an excimer laser. The present invention encompasses both of these scenarios.

In particular, the present invention encompasses embodiments wherein the illuminator IL is configured to supply a projection beam of radiation having a wavelength of less than about 170 nm, such as with wavelengths of 157 nm, 126 nm and 13.6 nm, for example.

The projection beam PB subsequently intercepts the mask MA, which is held on the mask table MT. Having traversed the mask MA, the projection beam PB passes through the lens PL, which focuses the beam PB onto a target portion C of the substrate W. With the aid of the second positioning device PW and interferometric measuring system IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:
1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g. the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The interferometric measuring system typically can include a light source, such as a laser (not shown), and one or more interferometers IF configured to determine some information (e.g., position, alignment, etc.) regarding an object to be measured, such as a substrate or a stage. In FIG. 1, for example, one interferometer IF is schematically depicted. The light source (laser) produces a metrology beam MB which is routed to the interferometer IF by one or more beam manipulators. In case more than one interferometer is present, the metrology beam is shared between them, by using optics that split the metrology beam in various separate beams for each interferometer.

A substrate alignment system MS configured to align a substrate on table WT with the mask MA on mask table MT, is schematically shown at an exemplary location close to substrate table WT, and includes at least one light source which generates a light beam aimed at a marker structure on the substrate and at least one sensor device which detects an optical signal from that marker structure. It is noted that the location of the substrate alignment system MS depends on design conditions which may vary with the actual type of lithographic projection apparatus. The marker structures may be for example substrate alignment marks P1, P2.

Figure 2:
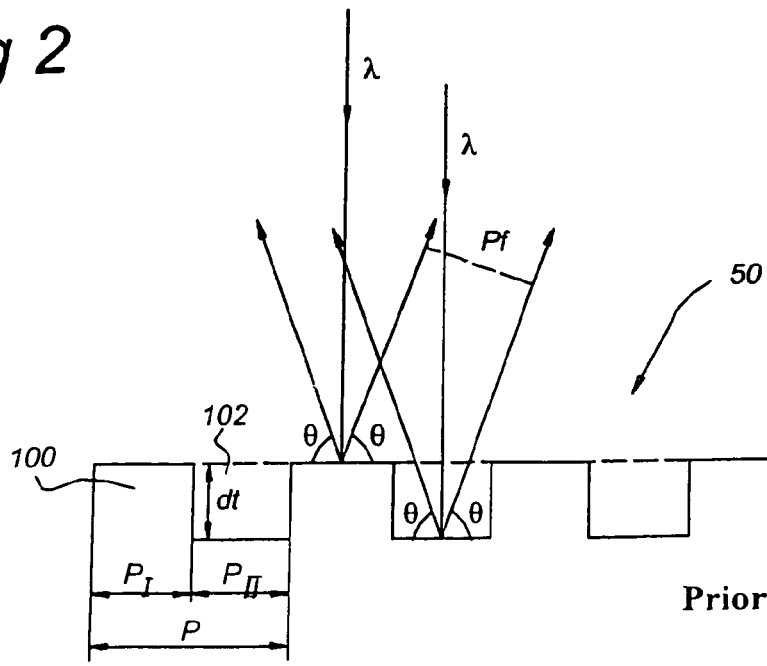
FIG. 2 schematically shows a cross-sectional view of a prior art marker structure to illustrate the concept of phase depth.

FIG. 2 schematically shows a cross-sectional view of a prior art marker structure to illustrate the concept of phase depth.

An optical marker structure typically includes a grating 50 with a periodicity P suitable for diffraction of impinging light with a wavelength λ. Where the term "light" is used in the present document, it is not limited to wavelengths within the visible spectrum but may encompass light of longer wavelength or shorter wavelength than visible wavelengths. It will be appreciated that it is not essential that the periodicity P be suitable for diffraction of light within the visible spectrum, and that the invention can be implemented with a periodicity P suitable for shorter wavelengths or suitable for longer wavelengths.

The grating includes a series of lines 100, with interposed trenches 102. The trenches 102 have a depth $d_t$ with respect to the top surface of the lines 100. The periodicity P of the grating is composed of a line width $P_I$ and a trench width $P_{II}$.

In FIG. 2, an impinging light beam λ is directed in a direction substantially perpendicular to the surface of the substrate. Alternatively, a non-perpendicular inclination of the impinging beam may be used.

The marker grating from the prior art is a so-called phase grating. A diffraction pattern is schematically shown by two diffracted beams, each having a diffraction angle θ relative to the surface.

In the diffraction pattern the position of intensity maxima and minima is governed by the periodicity of the grating. When the wavelength λ of the impinging light is within the range of visible light, periodicity P may typically be 16 μm to obtain a diffraction pattern suitable for purpose of alignment. Typically, the line width $P_I$ and trench width $P_{II}$, are each 8 μm.

In order to obtain sufficient diffracted light from the grating 50 and to obtain an angular distribution (a diffraction pattern) of well-defined diffraction maxima and minima, the grating 50 must encompass a minimal number of lines 100 and intermediate trenches 102 which are illuminated by the impinging light beam. In the prior art, a marker includes at least 10 trenches within the illuminated area.

The intensity of the diffracted beams is further determined by the depth $d_t$ of the trenches 102 relative to the top surface of the lines 100. In a certain direction of diffracted light, the light rays scattered at the top surface of the lines 100 and the light rays scattered at the bottom of the trenches 102 must have a certain phase relation to obtain a positive interference between these light rays in that direction, independent from the periodicity P. The depth $d_t$ of the trenches 102 relative to the surface of the lines 100 must be such that positive interference will occur. If the interference is negative, an extinction of the signal will occur. This is known as the phase depth condition.

In the phase grating 50, the interference in the diffraction pattern can be schematically deduced as follows: under angle θ a first set of photons reflect on the top surfaces of the lines 100, while a second set of photons reflect at the floor of the trenches 102. In order to determine if in a given direction, indicated by diffraction angle θ, an intensity maximum or minimum will occur, the phase difference of photons originating from the line top surfaces and from the trench floors must be substantially zero or half a wavelength, respectively, at the propagation front PF.

For an optical marker structure on a semiconductor wafer, the structure may be exposed to various deformations during the processing steps of the semiconductor wafer to form integrated circuits. Due to these deformations the phase depth $d_t$ may change during manufacturing.

Figure 3A:
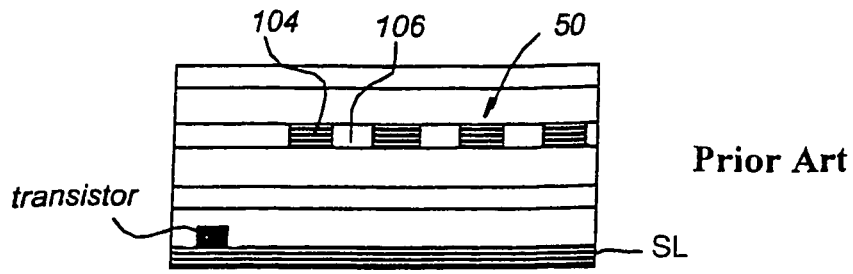
FIG. 3a schematically shows a cross-sectional view of a marker structure from the prior art in copper-damascene layers.

FIG. 3a schematically shows a cross-sectional view of a marker structure from the prior art. In FIG. 3a, an optical marker structure 50 on a substrate layer SL is shown which may be applied in back end of line (BEOL) IC processes for copper (Cu)-based micro-electronic devices. Such devices are typically manufactured by so-called Cu damascene process technology, wherein copper structures are embedded in (optically transparent) dielectric material, appearing as a "floating marker". The optical marker 50 includes a plurality of Cu line elements 104, embedded in dielectric material, wherein the dielectric material is shaped as a plurality of line elements 106. Typically, the dielectric material may consist of a stack of various separate dielectric layers. By consequence, the phase depth $d_t$ of the marker 50 may be ill-defined due to variations in the thickness of various separate dielectric layers in the dielectric stack. Moreover, variations may exist across a die or a wafer. Thus, in a worst case, the intensity of the marker's signals as included in the diffraction pattern may be too weak for detection by the alignment tool. This may result in a marker reject or even a wafer reject during IC processing.

Figure 3B:
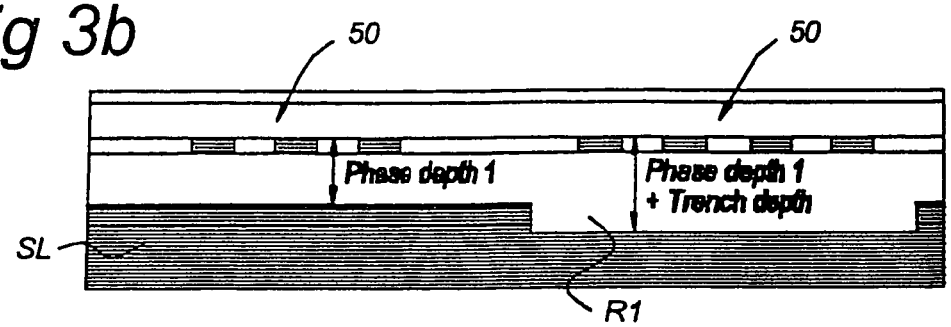
FIG. 3b schematically shows a cross-sectional view of a marker structure according to a first embodiment of the present invention.

FIG. 3b shows a cross-sectional view of a marker structure according to a first embodiment of the present invention.

A way to avoid extinction due to an incompatible phase depth is shown in FIG. 3b. In FIG. 3b entities with the same reference number refer to the same entities as shown in FIG. 3a. In the area of the semiconductor substrate layer (or in general an opaque layer) SL under the floating marker 50, a recess R1 is created in front end of line (FEOL) process. This recess increases the phase depth and thus reduces the probability of negative interference between scattered light from the surface level and the level of the substrate or opaque layer.

As shown in FIG. 3b, the recess R1 may be formed only under a portion of area covered by the floating marker 50, in which case two different phase depths are present, one of which may yield a better usable diffraction signal of sufficient intensity.

Figure 3C:
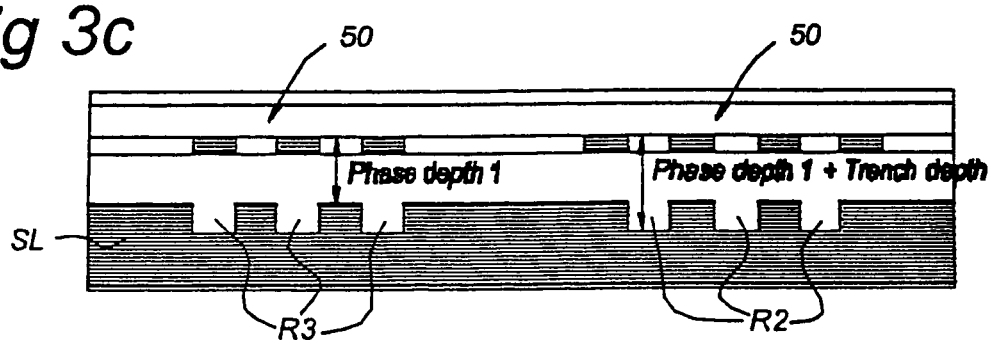
FIG. 3c schematically shows a cross-sectional view of a marker structure according to a second embodiment of the present invention.

FIG. 3c shows a cross-sectional view of a marker structure according to a second embodiment of the present invention.

In the second embodiment, the recess is defined during a FEOL process only below a portion of the marker 50. As indicated in the right-hand side of FIG. 3c, recesses R2 are formed only below the transparent portions of the marker 50. In the left-hand side of FIG. 3c, recesses R3 are formed only below the opaque portions of the marker 50. Again, two different phase depths are present, each of which may yield a usable diffraction signal of sufficient intensity.

It is noted that recesses R2, R3 may be formed by using the mask of the marker and an appropriate lithographic process, with a positive or negative exposure, respectively.

The recesses shown in FIG. 3b or 3c preferably add about 200-300 nm to the phase depth.

A further disadvantage of prior art markers is due to the dependence of marker properties as a function of the layer(s) below the marker. It is known that due to different optical behaviour of the various layers, as found in semiconductor devices, the contrast of the marker may vary, which results in variations of the diffracted intensity as function of the layer below, i.e. the phase depth strongly varies as a function of the underlying layer.

Figure 4:
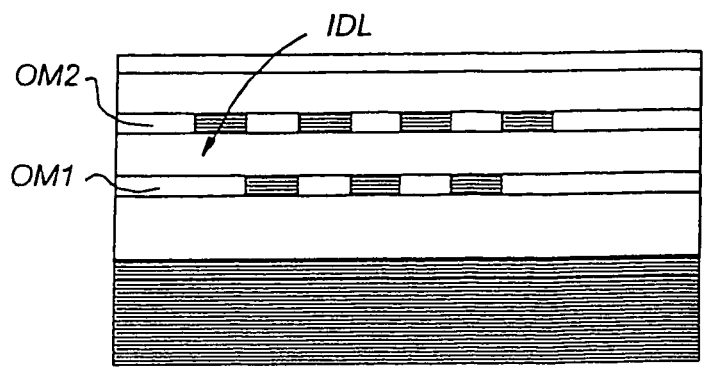
FIG. 4 schematically shows a cross-sectional view of a marker structure according to a third embodiment of the present invention.

FIG. 4 schematically shows a cross-sectional view of a marker structure according to a third embodiment of the present invention.

In the third embodiment, the phase depth is better controlled by defining a first optical marker OM1 in a first metal layer (by exposure and processing) in a first ordering tone, i.e., a given periodic repetition of a first structural element and a second structural element. Next, in a second metal layer stacked on the first one with at least one intermediate dielectric layer IDL, a second optical marker OM2 with the same first ordering tone, but in reverse tone relative to the first marker, is defined (exposed and processed). The reverse tone indicates that the second marker OM2 comprises the same periodic repetition as the first optical marker OM1, but the locations of the first structural element and the second structural element are exchanged relative to the first marker OM1.

By control of the intermediate dielectric layer IDL the phase depth can be controlled: i.e., a phase depth value is selected which yields a diffraction signal of sufficient intensity. Moreover, the space occupied by the markers within a scribelane of the wafer is strongly reduced by stacking optical markers.

It is noted that the thickness of the intermediate dielectric layer IDL is usually determined by the IC processing parameters. If, accidentally, the thickness of the intermediate dielectric layer IDL between the stacked markers corresponds to a phase depth which causes negative interference for a wavelength used by the substrate alignment system, a second wavelength may be used.

Figure 5:
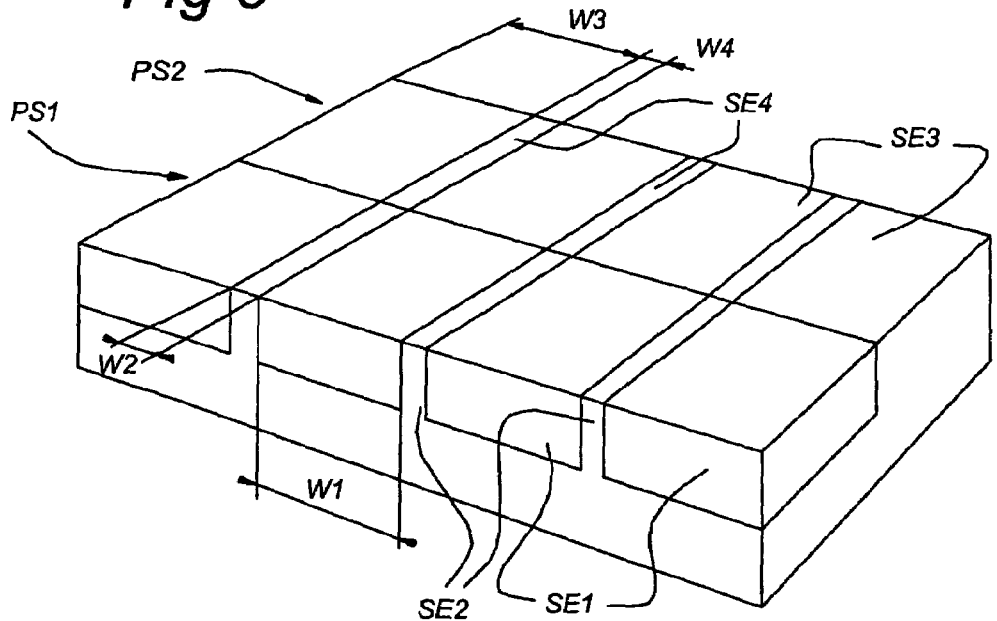
FIG. 5 schematically shows a marker structure according to a fourth embodiment of the present invention in a perspective view.

FIG. 5 schematically shows a marker structure according to a fourth embodiment of the present invention in a perspective view.

Various processing steps during IC fabrication may adversely influence the shape of alignment markers. For example, the block shape of the lines in the optical marker structure may change due to a CMP step. Due to the CMP process the cross-section of lines becomes asymmetrical: the polishing rounds only one of the top edges, basically due to the (local) polishing direction.

Due to the effect on the shape, the alignment by such modified markers (rounded at one edge) may include an error which results from the fact that the modified shape of the marker results in a change of the diffraction pattern being generated. Typically, a modification of the shape of the marker results in a shift of the position of the diffraction peaks generated by the optical marker structure relative to the position of the peaks for the pristine marker shape. In the prior art, it has not been possible to distinguish between a genuine misalignment of a marker or a modification of the marker shape, since both events lead to a change of the diffraction pattern and/or peak positions in the pattern.

The optical marker structure according to the fourth embodiment provides a possibility to check whether the shift of the pattern is due to misalignment of the marker or due to deformation of the marker induced by IC processing.

The optical marker includes a first periodic structure PS1 in a first portion, and a second periodic structure PS2 in a second portion. The first and second periodic structures PS1 and PS2 are located adjacent to each other with their respective periodicity running parallel in one direction.

The first periodic structure PS1 has the same periodicity as PS2 but it's ordering of structural elements is complementary to the second periodic structure PS2. The first periodic structure PS1 includes a plurality of first structural elements SE1 of a first material with a first width w1 and a plurality of second structural elements SE2 of a second material with a second width w2, which are arranged periodically.

The second periodic structure PS2 includes a plurality of third structural elements SE3 of the second material with a third width w3 and a plurality of fourth structural elements SE4 of the first material with a fourth width w4, which are arranged periodically. Since PS1 is complementary to PS2, the first structural element SE1 is adjacent to the third structural element SE3 with the first width w1 being equal to the third width w3, and the second structural element SE2 is adjacent to the fourth structural element SE4 with the second width w2 being equal to the fourth width w4. Further, the periodic structures PS1 and PS2 are each asymmetric: the first and second widths differ from each other.

As an example, the optical marker structure may be arranged as a Cu damascene structure, with Cu as first material, and an insulator as the second material; the periodic variation of the Cu and insulator causing the marker structure to act as a diffraction grating. Thus, for example SE1 and SE4 include Cu and SE2 and SE3 include insulator. The width w1 of SE1 is equal to the width w3 of SE3, and the width w2 of SE2 is equal to the width w4 of SE4.

It is noted, however, that such a marker may also be embodied in a metal-semiconductor structure or a metal-insulator structure. Also, this complementary optical marker structure can be formed by two complementary geometric gratings (i.e., lines and trenches) etched in the semiconductor substrate and located next to each other.

The use of complementary features in the marker structure results in a fixed signal (with zero level) during measurement. If the periodic structures PS1 and PS2 are substantially complementary, a first signal from the first periodic structure PS1 will be the complement of a second signal from the second periodic structure PS2. The first and second signal cancel each other, and the combined signal of first and second signal as measured by a sensor will have a substantially zero level.

Due to processing effects on the structure as described above, the first periodic structure PS1 changes in a different manner than the second periodic structure PS2 because of the different asymmetry of both structures. In the first periodic structure PS1 the metal lines SE1 may have a different width w1 than the width w4 of the metal lines SE4 in the second periodic structure PS2. Due to the difference in width of the metal lines and insulator lines in the respective structures PS1 and PS2, the change of the shape of the respective lines will be different.

Due to this different modification of the two structures, the first signal from PS1 is no longer the complement of the second signal from PS2. By consequence, the complementary grating will no longer display a zero level signal during measurement. Instead a non-zero signal will be measured.

The occurrence of such a signal from the complementary optical marker structure indicates process-related influences on the marker. Thus the presence of processing-induced effects on other markers with similar periodicity and the drift of these effects can advantageously be monitored by this complementary optical marker structure.

In certain IC metallisation processes, a buried marker (i.e., an optical marker structure below the metallisation layer) is still detectable due to a residual topography at the surface. In that case, the geometric shape of the marker structure i.e., the lines and trenches, are still visible in the surface of the metallisation layer as elevated and low-lying regions, respectively.

However, in IC processing, chemical-mechanical polishing (CMP) is applied as planarisation technique for W contacts and vias. By CMP the top surface is flattened, and any residual topography is lost. It has become impossible to align using a residual marker structure in such a case.

Figure 6:
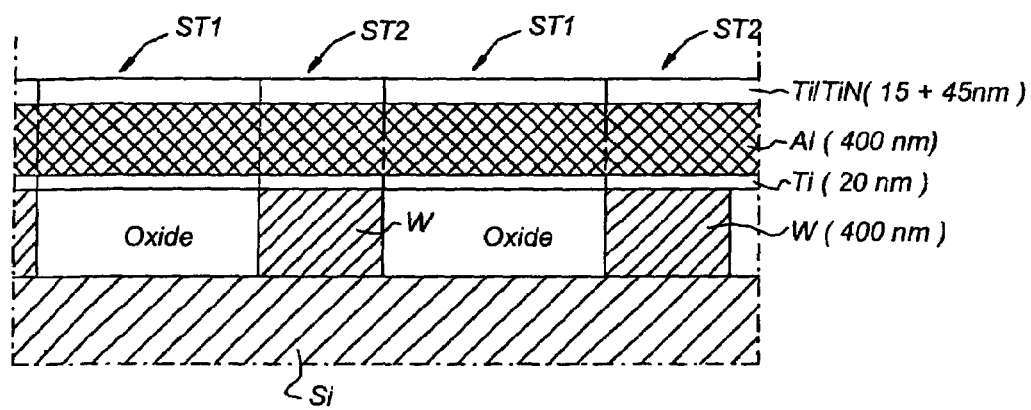
FIG. 6 schematically shows a planar view of a marker structure according to a fifth embodiment of the present invention.

FIG. 6 shows a planar view of a marker structure according to a fifth embodiment of the present invention.

In the fifth embodiment of the present invention, a marker structure is formed in the aluminium metallisation layer which acts as an amplitude marker structure. FIG. 6 shows a layer stack which is formed during BEOL processing: in the trenches a tungsten W contact is formed. By CMP the surfaces of the W contact and insulator Oxide are planarized. On the planarized surface a Ti adhesion layer is deposited. Next, Al is deposited by a hot metal deposition process. Finally, a capping layer of Ti/TiN is deposited. In FIG. 6, some exemplary values for the thickness of the respective layers are indicated.

The metallization layer includes a hot metal process (deposited by physical vapor deposition, typically at about 350° C. under UHV conditions). Due to the different grain growth of Al on the Ti adhesion layer covering W and covering silicon dioxide, respectively, a different surface state is created in the Al layer depending on the under-lying material. Above the W contacts or plugs, the surface has a first surface state ST2, and above the oxide, the surface has a second surface state ST1.

Possibly, the Ti layer may have a different texture depending on the underlying material. This texture may influence the nucleation and grain growth of Al deposited during a hot metal deposition process in a manner differently for the area covering W and the area covering silicon dioxide. The difference in surface state relates to a difference in morphology, i.e., texture and/or grain size of the metallization layer depending on the underlying material. Alternatively, the different nucleation and grain growth of Al on W or Al on silicon dioxide may also be caused by differences in thermo-physical properties of the underlying material since the Ti layer is relatively thin.

In either case, due to whatever physical-chemical cause, the local difference in surface state is detectable by the alignment- and/or overlay-sensor system as a marker structure.

It is noted that such a morphological marker structure is not limited to the specific structure described in FIG. 6. The metallization layer may show a periodic variation of a surface state also due to some other underlying materials (processed by CMP) which form a periodic structure.

In the prior art, markers on a semiconductor substrate that comprise trenches filled with tungsten, are subjected to a CMP process for removing tungsten and planarizing the surface of the substrate. Due to the combination of W-CVD and CMP, the tungsten structures are either filled or underfilled. The extent of filling is related to the phase depth of an optical signal generated by the marker, i.e., two discrete phase depth levels exist.

One level relates to filled tungsten structures which are shallow and have a small phase depth due to the substantially complete fill up to the top of the structure.

The other level relates to underfilled tungsten structures which are relatively deep and have a large phase depth.

Small phase depth of the filled markers is undesirable since the alignment error caused by the small phase depth is relatively large. Also, the large phase depth does not guarantee that the alignment error is reduced: the phase depth may be such that extinction of the optical signal results.

Figure 7A:
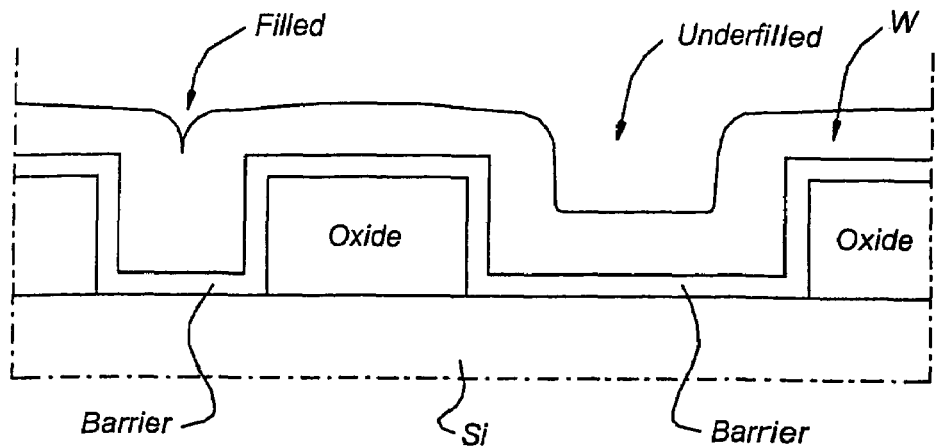
FIG. 7a schematically shows a cross-sectional view of a filled and underfilled tungsten marker from the prior art before chemical-mechanical polishing of tungsten.

FIG. 7a shows a cross-sectional view of filled and under filled tungsten markers from the prior art, before CMP of the tungsten W.

In a trench etched within a silicon dioxide layer, tungsten is deposited by a CVD process in blanket mode. FIG. 7a illustrates that the width of the trench governs whether the conformally grown tungsten layer fills the trench in a 'filled' or 'underfilled' mode.

During CVD of tungsten W with conformal growth characteristics, narrow trenches will become 'filled' trenches, while wide trenches will become 'underfilled'.

The bottom of the trench may be covered by a barrier layer.

Next, a CMP process is carried out to planarize the structure. In this manner, a metal (W) structure with a surface substantially on level with the silicon dioxide surface is formed. As a consequence, the phase depth of the 'filled' structure is substantially zero. The 'underfilled' metal structure comprises portions (i.e., the side-walls) which are substantially on level with the silicon dioxide surface, and a central portion which surface is well below the silicon dioxide surface level. After CMP, the central tungsten W portion has a given phase depth relative to the silicon dioxide surface level.

For a given depth of the trenches, and for a tungsten deposition process with given processing parameters (i.e., a conformal W layer with a given thickness is formed), the width of the trench determines whether a tungsten line will either be filled or underfilled. Thus, the phase depth will comprise two discrete levels as a function of the trench width. Furthermore, due to different resistance to CMP of tungsten and silicon dioxide, the CMP process can not be controlled very accurately.

As mentioned above, in a marker structure comprising underfilled metal marker lines the depth of the central portion of the metal line may be such that the phase depth is substantially zero: no control over the phase depth is obtained.

Figure 7B:
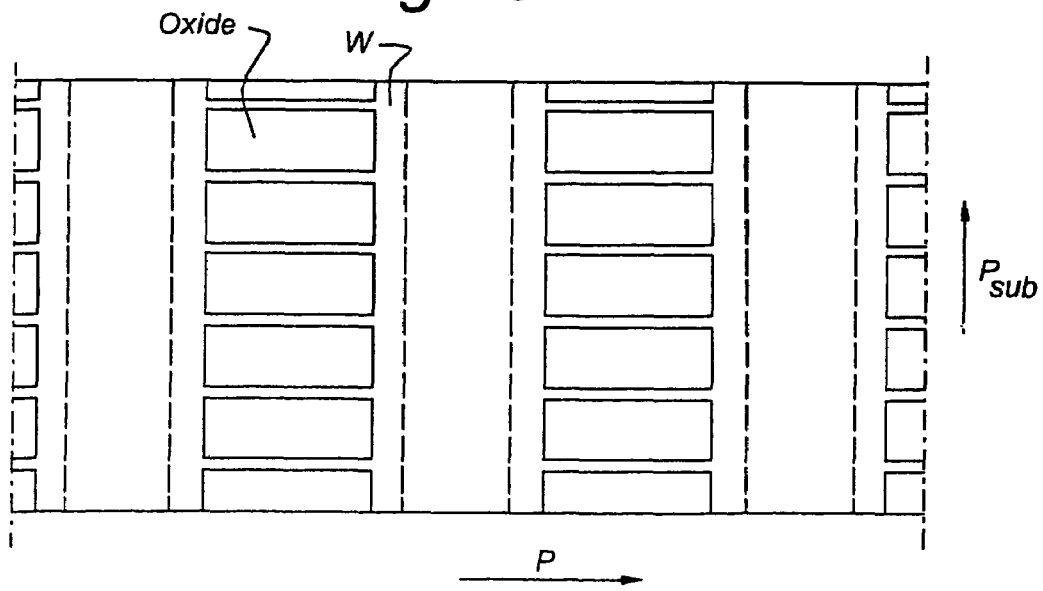
FIG. 7b schematically show a planar view of a tungsten marker structure in silicon dioxide according to a sixth embodiment of the present invention.
Figure 7C:
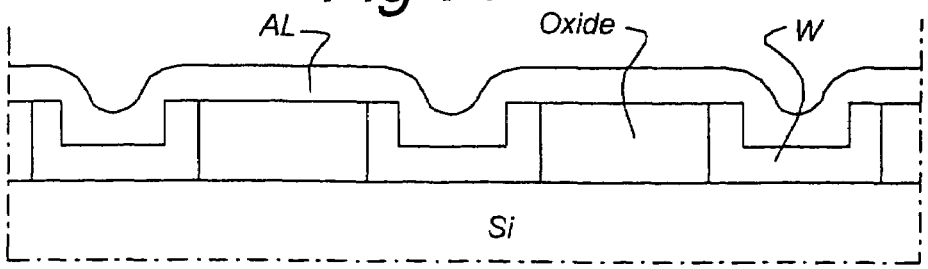
FIG. 7c schematically shows a cross-sectional view of the tungsten marker structure in silicon dioxide of FIG. 7b.

FIGS. 7b and 7c show planar and cross-sectional views, respectively, of a tungsten marker structure in silicon dioxide according to a sixth embodiment of the present invention.

In the sixth embodiment, the optical marker structure includes tungsten sub-segments in the silicon dioxide lines.

As sub-segments, a plurality of sub-trenches are formed in the silicon dioxide lines, with the length direction of sub-trenches extending in a direction parallel to the periodicity P of the marker structure. Since the plurality of sub-trenches are periodically arranged in a direction which will be a so-called non-scanning direction during alignment procedures, the optical effect of the periodic arrangement of the sub-trenches in that direction Psub is not detected by the substrate alignment system. The possible diffraction signal generated by (the periodicity of) the sub-trenches is directed in a direction perpendicular to the direction of the diffraction signal of the actual marker structure (i.e., the repetition of tungsten trenches and silicon dioxide lines), so this possible signal is not detected by the substrate alignment system.

The trenches and sub-trenches are filled with tungsten by a tungsten CVD process. Next, a CMP process is carried out to planarize the structure. Due to the presence of tungsten in the sub-trenches, the CMP process is in better control. By using sub-trenches the area of the marker structure comprising filled tungsten structures with their specific resistance to CMP is relatively enlarged (tungsten is more resistant to CMP than oxide). This allows polishing of the filled trenches to a given height with greater accuracy. By better controlling the polished height of the filled trenches relative to the level of the lower portions of the underfilled structures, the phase depth may be controlled. The height of the top level of the filled tungsten structure relative to the lower level of tungsten in the underfilled region may be adapted to obtain a desired phase depth. The phase depth may be adapted by changing the spacing between the sub-trenches (and their number) in the silicon dioxide lines to change the relative area of filled W structures.

The width of the sub-trenches is double the thickness of the conformal tungsten layer (which thus results in a completely filled sub-trench having a zero phase depth).

The influence of optical markers on IC processing may lead to undesirable side effects due to the fact that the optical markers are inherently larger than feature sizes in integrated circuits. In the prior art, the minimum feature size of markers is in the order of 1 μm. In current microelectronic devices, the typical minimal feature size is about 100 nm (depending on the device generation). Since the marker usually includes the same material as (part of) the devices, the presence of an additional marker area of a substantial size in the vicinity of a device may have an influence on the local processing rate for that device in a given processing step. For example, a chemical reaction in a reactive ion etching process or a chemical deposition process may be influenced by the presence of a large marker area due to some kinetic constraint, or due to a local deviation of the wafer temperature, etc. A chemical mechanical polishing process may be influenced by the presence of a large marker area due to some mechanical constraint (i.e., a higher or lower resistance to CMP) caused by the marker area.

A size difference between marker and device feature may thus lead to modification of a processing step for devices located closely to a marker. Due to the modification of the processing a variation of device characteristics may occur across a die and/or a wafer.

From the viewpoint of IC manufacturing, a change of dimensions of the marker's structural elements to have them correspond more closely to critical feature sizes in devices may overcome the problem of the size dependency of IC processes. However, a change of "line" and "trench" widths may also change the periodicity of the marker. This would adversely require a major effort to redesign alignment- and overlay-sensor systems to comply with a new marker periodicity.

Moreover, since alignment systems use linearly polarized laser light, polarization effects resulting from interaction with such a modified marker structure may adversely result in strongly reduced signal strengths in such alignment systems.

To overcome this size dependency of IC processes, the inventors recognized that the optical marker structure from the prior art is required to be segmented in such a way that critical device features are better mimicked while the diffraction pattern generated by the modified marker structure remains substantially the same as for an unmodified marker from the prior art. Also, the alignment system is arranged in such a way that polarization effects results in usable signal strength of measured signals.

Figure 8:
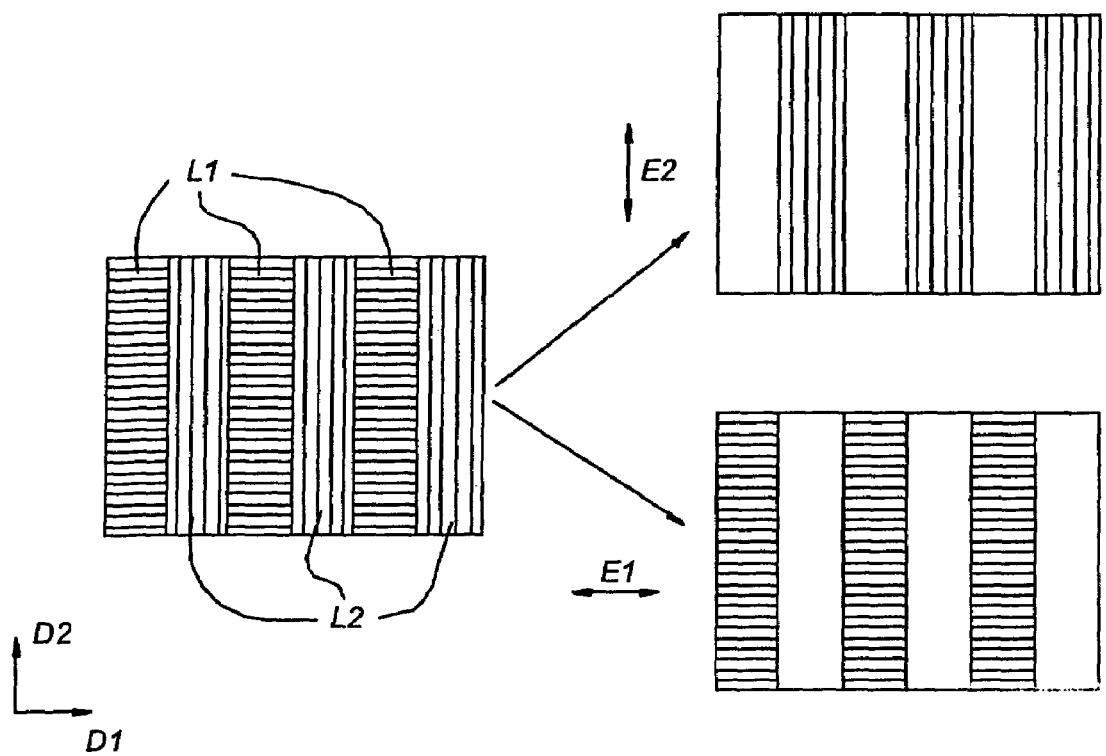
FIG. 8 shows a planar view of a marker structure according to a seventh embodiment of the present invention.

FIG. 8 shows a planar view of a marker structure according to a seventh embodiment of the present invention.

In the seventh embodiment, the first structural elements are sub-segmented in a plurality of primary lines L1 extending in a first direction D1, each primary line having a width comparable to critical feature sizes of a device. In between the primary lines are interposed lines of a different material. The width of the primary and interposed lines is such that dense device structures with critical feature sizes are mimicked.

Further, the second structural elements in between the first structural elements are sub-segmented in a plurality of secondary lines L2 extending in a second direction D2, with interposed lines of a different material in between. Again, the secondary lines and interposed lines have widths comparable to dense device structures with the critical feature sizes for devices. The second direction D2 is perpendicular to the first direction D1.

The material of the primary lines L1 and the secondary lines L2 is typically the same, e.g., a metal, while the material in between the primary lines L1 and in between the secondary lines L2 may be a dielectric or a semiconductor.

In the sub-segmentation the original periodicity P of the marker structure is maintained to allow the application of the alignment sensors from the prior art.

It is further noted that the width of the primary line L1 may or may not be equal to the width of a secondary line L2.

The alignment system uses a first laser beam with a first linear polarization E1 and a second laser beam with a second linear polarization E2. The wavelength of the first laser beam differs from the wavelength of the second laser beam. For example, the first laser beam includes a red light, and the second laser beam includes a green light.

The first linear polarization direction E1 is perpendicular to the second linear polarization direction E2. Further, the first linear polarization E1 is arranged in such a way that the line segments L1 in the marker lines allow a further transmission of the first polarized light beam in order to form a diffraction pattern of the marker structure. Similarly, the second linear polarization E2 is arranged in such a way that the line segments L2 in the intermediate marker elements allow a further transmission of the second polarized light beam to form a diffraction pattern of the marker structure.

Figure 9:
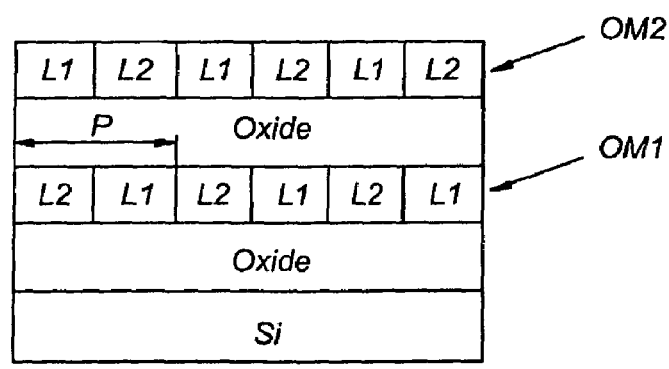
FIG. 9 shows an application of a stack of markers in accordance with the seventh embodiment of the present invention.

FIG. 9 shows an application of a stack of markers in accordance with the seventh embodiment of the present invention. A further advantage of the structure of the seventh embodiment is the fact that at least two of such markers can be stacked on top of each other, without causing any interference between them. By stacking marker structures in subsequent layers, the needed estate for the marker structures in the scribelane can be significantly reduced. In the example of FIG. 9, in such a stack, a second marker OM2 is translated over half the periodicity P with respect to the first marker OM1, with the width of "lines" being equal to the width of "trenches". Due to the segmentation of the "trenches" and "lines" perpendicular to each other, the polarization effect prohibits cross-talk between the upper and lower marker structure. When using the first and second laser beams with their mutual perpendicular polarization, the lower marker structure appears covered by the upper marker: the alignment system only detects the upper marker structure.

While specific embodiments of the invention have been described above, it will be appreciated that the invention may be practiced otherwise than as described. The description is not intended to limit the invention.

What is claimed is:

1. An alignment method using a marker structure, the method comprising:
    providing at least one light beam directed on a marker structure comprising a plurality of first structural elements, and a plurality of second structural elements, wherein at least one first structural element of the plurality of first structural elements comprises a plurality of primary lines and a plurality of first interposed lines;
    detecting light received from the marker structure at a sensor; and
    determining alignment information from the detected light, the alignment information comprising information relating to a position of the marker structure, wherein the at least one light beam has a linear polarization extending substantially perpendicular to a direction of a periodic structure formed by the plurality of first interposed lines, or the sensor has a polarization filter which allows transmission of light having that linear polarization.

2. The alignment method according to claim 1, wherein the plurality of first interposed lines are arranged in a parallel configuration to the plurality of primary lines.

3. The alignment method according to claim 1, wherein the plurality of primary lines are composed of a different material than the plurality of first interposed lines.

4. The alignment method according to claim 1, wherein the at least one light beam includes a first light beam and a second light beam that are directed on the marker structure, the second light beam having a polarization direction that is substantially perpendicular to the first light beam.

5. The alignment method according to claim 4, wherein the first light beam and the second light beam have different wavelengths.

6. The alignment method according to claim 1, wherein at least one second structural element of the plurality of second structural elements comprises a plurality of secondary lines and a plurality of second interposed lines, the plurality of second interposed lines forming a periodic structure in a direction substantially perpendicular to the direction of the periodic structure formed by the plurality of first interposed lines.

7. The alignment method according to claim 6, wherein the at least one light beam is configured to be transmitted by the plurality of primary lines.

8. The alignment method according to claim 1, wherein the plurality of first and second structural elements are arranged to form a diffraction grating.

9. The alignment method according to claim 8, wherein the periodic structure extends in a direction substantially perpendicular to a periodic direction of the diffraction grating.

10. The alignment method according to claim 8, wherein the periodic structure extends in a direction substantially parallel to a periodic direction of the diffraction grating.

11. The alignment method according to claim 1, wherein the marker structure is a first marker structure and wherein there is a second marker structure located under the first marker structure, the second marker structure comprising a plurality of first structural elements, and a plurality of second structural elements, wherein at least one first structural element of the plurality of first structural elements of the second marker structure comprises a plurality of primary lines and a plurality of first interposed lines.

12. The alignment method according to claim 11, wherein the plurality of first structural elements of the first marker structure cover the plurality of second structural elements of the second marker structure.

13. An alignment method using a marker structure, the method comprising:
    providing at least one light beam directed on a marker structure comprising a plurality of first structural elements, and a plurality of second structural elements, wherein at least one first structural element of the plurality of first structural elements comprises a plurality of primary lines and a plurality of first interposed lines;

detecting light received from the marker structure at a sensor; and determining alignment information from the detected light, the alignment information comprising information relating to a position of the marker structure, wherein the at least one light beam has a linear polarization extending substantially parallel to a direction of a periodic structure formed by the plurality of first interposed lines, or the sensor has a polarization filter which allows transmission of light having that linear polarization.

14. The alignment method according to claim 13, wherein the plurality of first interposed lines are arranged in a parallel configuration to the plurality of primary lines.

15. The alignment method according to claim 13, wherein the plurality of primary lines are composed of a different material than the plurality of first interposed lines.

16. The alignment method according to claim 13, wherein the at least one light beam includes a first light beam and a second light beam that are directed on the marker structure, the second light beam having a polarization direction that is substantially perpendicular to the first light beam.

17. The alignment method according to claim 16, wherein the first light beam and the second light beam have different wavelengths.

18. The alignment method according to claim 13, wherein at least one second structural element of the plurality of second structural elements comprises a plurality of secondary lines and a plurality of second interposed lines, the plurality of second interposed lines forming a periodic structure in a direction substantially perpendicular to the direction of the periodic structure formed by the plurality of first interposed lines.

19. The alignment method according to claim 18, wherein the at least one light beam is configured to be transmitted by the plurality of secondary lines.

20. The alignment method according to claim 13, wherein the plurality of first and second structural elements are arranged to form a diffraction grating.

21. The alignment method according to claim 20, wherein the periodic structure extends in a direction substantially perpendicular to a periodic direction of the diffraction grating.

22. The alignment method according to claim 20, wherein the periodic structure extends in a direction substantially parallel to a periodic direction of the diffraction grating.

23. The alignment method according to claim 13, wherein the marker structure is a first marker structure and wherein there is a second marker structure located under the first marker structure, the second marker structure comprising a plurality of first structural elements, and a plurality of second structural elements, wherein at least one first structural element of the plurality of first structural elements of the second marker structure comprises a plurality of primary lines and a plurality of first interposed lines.

24. The alignment method according to claim 23, wherein the plurality of first structural elements of the first marker structure cover the plurality of second structural elements of the second marker structure.

25. A lithographic projection apparatus, comprising:

a support configured to support a patterning device, the patterning device configured to pattern a beam of radiation according to a desired pattern;

a substrate table configured to hold a substrate;

a projection system configured to project the patterned beam onto a target portion of the substrate; and a substrate alignment system configured to detect a position of the substrate relative to a position of the patterning device, wherein the substrate alignment system is configured to provide at least one light beam directed on a marker structure comprising a plurality of first structural elements, and a plurality of second structural elements, wherein at least one first structural element of the plurality of first structural elements comprises a plurality of primary lines and a plurality of first interposed lines, wherein the substrate alignment system is configured to detect light received from the marker structure and to determine the position from the detected light, and wherein the at least one light beam has a linear polarization extending substantially perpendicular to a direction of a periodic structure formed by the plurality of first interposed lines, or the substrate alignment system has a polarization filter which allows transmission of light having that linear polarization.

* * * * *